United States Patent [19]

Spigarelli et al.

[11] Patent Number: 4,775,775
[45] Date of Patent: Oct. 4, 1988

[54] PROGRAMMABLE ELECTRICAL HEATER

[75] Inventors: Donald J. Spigarelli, Carlisle; Mark Finocchario, Methuen, both of Mass.

[73] Assignee: SRTechnologies, Inc., Concord, Mass.

[21] Appl. No.: 62,903

[22] Filed: Jun. 16, 1987

[51] Int. Cl.⁴ .......................... F24H 3/00; H05B 3/02; H01C 10/14; H01C 1/01
[52] U.S. Cl. .................................. 219/382; 219/508; 338/318; 338/320
[58] Field of Search .............. 219/382, 508, 381, 374, 219/486; 338/318, 320

[56] References Cited

U.S. PATENT DOCUMENTS 4,536,642 8/1985 Hamster et al. ................. 219/382 X
4,675,509 6/1987 Hell ................................. 219/508 X

OTHER PUBLICATIONS

Wenesco Desoldering Stations, by Wenesco, Inc., Chicago, IL, Feb. 1986.
Ungar 4700, by Ungar, Division of Eldon Industries, Inc., copyright 1984.
Air-Vac-Rework Systems for Surface Mounted Devices, by Air-Vac Engineering Company, Inc., Milford, CT, copyright 1986.
Resistance Reflow Soldering Systems, Model TCW-119, by Consult Highes Welding and Reflow Soldering Products, p. 37.
Epoxy Dispensing System ED70, by Automation Unlimited, Inc., Woburn, MA, p. DS-11.
Craft 100, by Pace, Incorporated, Laurel, MD.

Primary Examiner—E. A. Goldberg
Assistant Examiner—M. M. Lateef
Attorney, Agent, or Firm—Weingarten, Schurgin, Gagnebin & Hayes

[57] ABSTRACT

A programmable heater which can be electronically programmed to provide an intended heat profile and intended heater power for application of heat only to an intended area. The heater is especially adapted for use in electronic circuit board repair systems. The heater comprises a matrix of electrical heater elements arranged in row and column configuration, each element being disposed within a respective tube terminating at a nozzle plane. Individual heater elements are selectively energized and the power applied to the heating elements is controlled to provide an intended heat level. Gas or air is supplied to the heater housing and flows through the tubes and out of the nozzle openings. Only the gas flowing through the tubes containing the energized heating elements is heated to provide a selected heat profile for application to a work surface.

15 Claims, 3 Drawing Sheets

PROGRAMMABLE ELECTRICAL HEATER

FIELD OF THE INVENTION

This invention relates to electrical heaters and more particularly to a heater which is programmable to provide selected heat profiles for precise heating of electronic or other sensitive components.

BACKGROUND OF THE INVENTION

In the repair of electronic circuits, it is often necessary to unsolder and remove electronic components such as integrated circuits for replacement by new components. To unsolder such components, heat must be applied to the leads or lead areas to melt the solder to permit detachment of the component from the circuit board or other circuit substrate. Such electronic components are usually heat sensitive, and therefore great care must be exercised to not apply heat sufficient to damage the components.

In systems presently known for the removal of electronic components from a circuit board, heat is applied to the soldered leads of the component by a nozzle which directs hot air or gas to a fixed area which encompasses the lead areas of the component. Different nozzles must be employed to heat areas of different size or configuration and thus an inventory of replacement nozzles must be employed to suit the range of electronic component types which are often encountered in practice. Systems are also known in which heat is applied by a configured tip which engages the lead areas of an electronic component to melt the solder and permit detachment of the component. Such heaters can include a vacuum pickup for lifting of the component after it has been unsoldered from the circuit board. In known systems, the heat nozzles or heat tips are of fixed construction and provide a heat area or pattern of fixed configuration. To change heat areas or patterns requires the physical replacement of the nozzle or heating tip.

SUMMARY OF THE INVENTION

The present invention provides a programmable heater which can be preprogrammed to provide intended heat profiles and intended heater power for application of heat only to an intended area. The novel heater has particular application in systems for circuit board repair, although the heater is not limited to this application, but has numerous applications where selectable heater power and profile are desired. In an embodiment especially adapted for use in circuit board repair, a housing is provided having a matrix of electrical heater elements arranged in row and column configuration. Each heater element is coupled by a diode to its associated row and column. Individual heater elements can be selectively energized by energy applied to the rows and columns at the intersection of which heaters are desired to be energized. In this manner, particular ones of the elements within the matrix can be selectively energized to provide an intended heat profile. The power applied to the heating elements can also be adjusted to provide an intended heat level. Each of the heater elements is within a respective tube which terminates at a matrix of nozzle plane. Gas or air is applied to the housing and flows through the tubes, the gas being heated by the energized elements to provide heated gas flow in the selected profile for application to a work surface. Preferably, the gas flow should be laminar to maintain a defined pattern for an intended distance beyond the nozzle plane.

A vacuum probe may be provided in the housing for use in pickup of components after desoldering and/or replacement of components for resoldering. Preferably, the probe is a vacuum probe disposed at the center of the matrix and extendable and retractable by an associated mechanism for use in removing components from a circuit board surface, and for replacement of components onto a circuit board surface.

The invention thus provides a heater which is electrically programmable to produce heat patterns of selected physical profile and thermal intensity. Heat sensors can be provided in the heater structure for use in automatic control of intended temperature. Sensing can be provided for example by thermocouples at one or more row and column positions within the heater.

DESCRIPTION OF THE DRAWINGS

The invention will be more fully understood from the following detailed description taken in conjunction with the accompanying drawings in which.

DETAILED DESCRIPTION OF THE INVENTION

Figure 1:
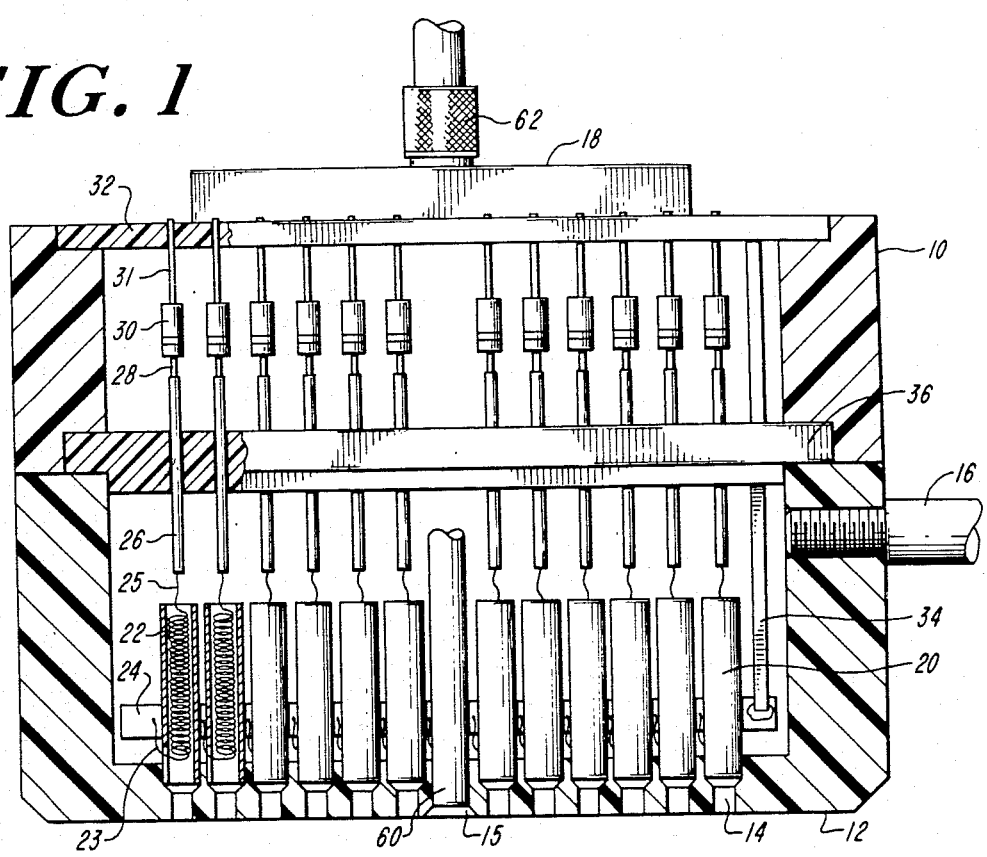
FIG. 1 is a sectional elevation view of a programmable heater in accordance with the invention.
Figure 2:
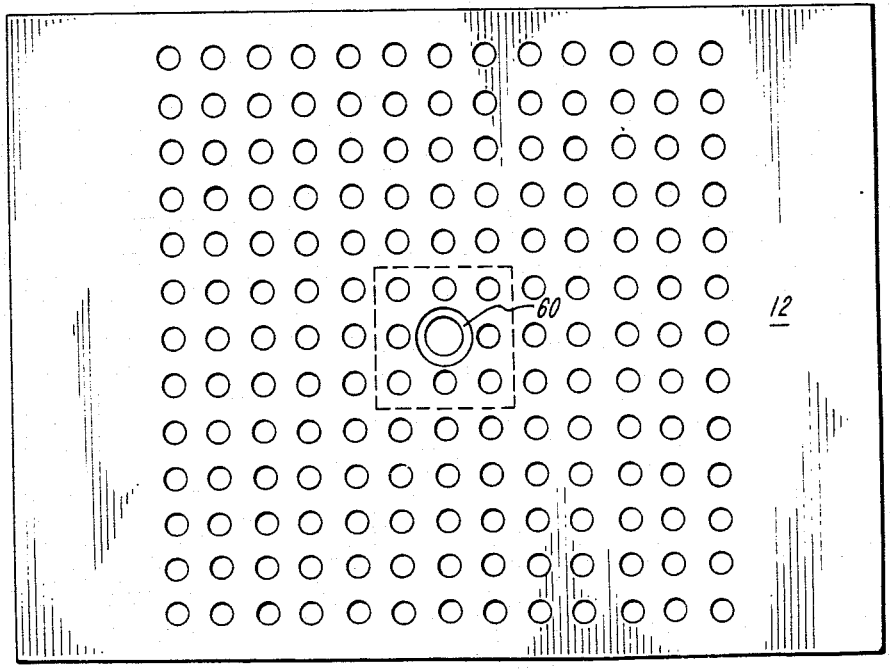
FIG. 2 is a bottom view of the heater of FIG. 1.

A programmable heater in accordance with the invention is shown in the drawing FIGS. 1 and 2 in a presently preferred embodiment. The heater comprises a housing 10 having a nozzle plate 12 containing an array of nozzle openings 14, a fitting 16 for coupling to a gas source, which typically can be Nitrogen, air or Argon, and an electrical connector 18 for coupling the heater by interconnected wiring to an electrical control. A tube 20, of suitable material such as ceramic or anodized aluminum, is attached at one end to the nozzle plate 12 in alignment with a nozzle opening 14, and an electrical resistance heater coil 22 is disposed within the tube. One end 23 of the heater coil is welded or otherwise electrically attached to a bus strip 24 disposed between rows of tubes 20. The other end 25 of the heater coil is connected such as by crimp fitting 26 to one lead 28 of a diode 30, the other lead 31 of which is connected to a printed circuit board 32. An array of electrical heater coils is similarly provided, each associated with a respective aperture of the nozzle plate. The heating coils are arranged in a rectilinear array of rows and columns, and each column of heater coils is connected to a common bus strip for that column. The bus strip is connected to a conductive rod 34 which is connected to the circuit board 32.

In the illustrated embodiment a guide template 336 is provided in spaced position from the circuit board 32 and containing and array of holes through which the crimp fittings are disposed. Each of the bus strips 24 is connected via its respective conductive rod 34 to a respective column terminal on the circuit board. The circuit board also contains a plurality of row terminals each of which is connected to the diodes of a respective row of heater coils. Particular heater coils can be energized by selectively energizing the row and column terminals so that the interconnected coils will be activated. In this manner, the heater coils can be selectively energized to provide an intended heat pattern. Other scanning arrangements can be employed in alternative implementations, as can other means of selective activation of the heaters.

Gas introduced into the housing from a suitable source via the air fitting 16 flows through all of the nozzle orifices 14, but only the gas flowing through the tubes 20 containing energized heater coils is heated to provide a selected pattern of heated gas emanating from the nozzle openings. Gas flowing through the tubes 20 which are not heated remains relatively cool and provides cooling of the areas outside of the heated pattern.

Figure 3:
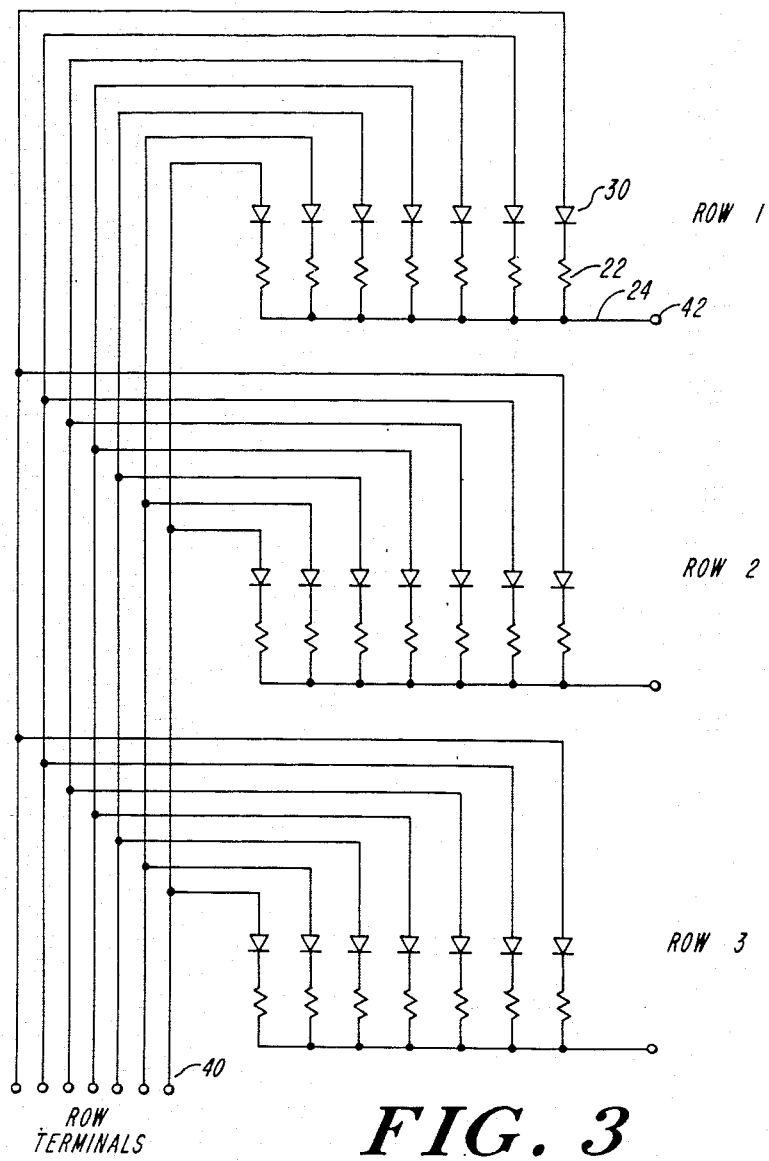
FIG. 3 is an electrical schematic diagram of the electrical connections of heater elements of the heater of FIG. 1.

An electrical schematic of the heater interconnections is shown in FIG. 3. The heating coils 22 of each row of the programmable heater are connected to respective diodes 30 which in turn are wired to respective row terminals 40 on circuit board 32. The heaters of each row are also connected in common via a bus strip 24 to a column terminal 42 also disposed on circuit board 32. The circuit board is coupled by means of connector 18 and associated wiring to an energizing source which includes control circuitry for selective energization of the heater coils in an intended pattern.

Figure 4:
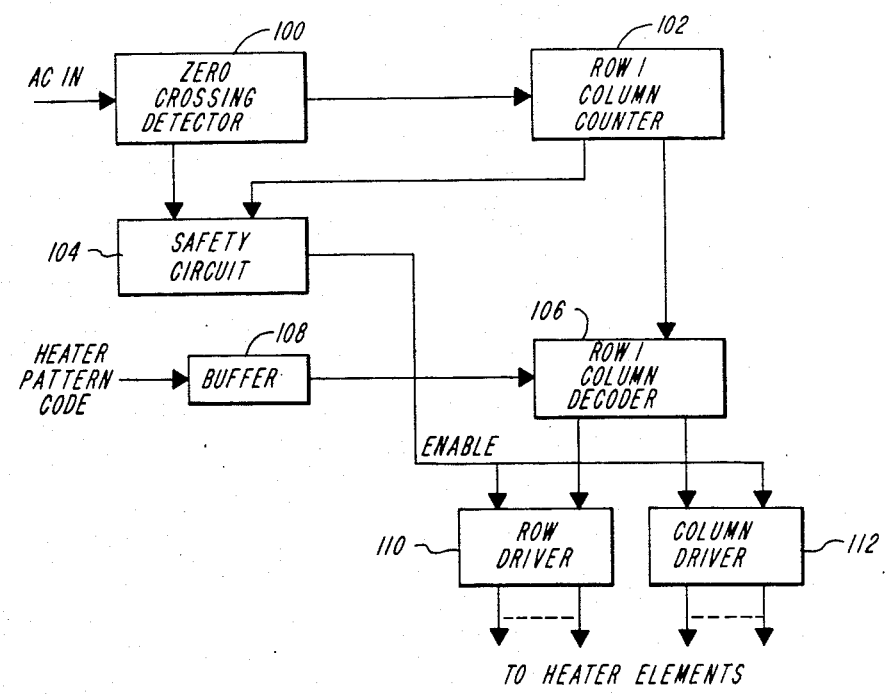
FIG. 4 is a block diagram of control circuitry employed to selectively energize the heater.

A block diagram of the heater control circuitry is shown in FIG. 4. AC power from a suitable source is applied to a zero crossing detector 100 which provides signals synchronized with the cross-over of the AC input to a row/column counter 102 and to a safety circuit 104. The safety circuit 104 also receives an input signal from counter 102. The counter 102 provides signals to a row/column decoder 106 which receives heater pattern code data from a buffer 108 which receives such data from a microcomputer or other data source. The decoder 106 provides signals to a row driver 110 and a column driver 112, these drivers providing energizing signals to the heater elements. Enabling signals for the drivers 110 and 112 are provided by the safety circuit 104.

In operation, the counter 102 is incremented with each zero crossing signal provided by detector 100 to provide scanning of the rows and columns of the heater matrix. In response to the counter signals, the decoder 106 provides signals identifying successive rows and columns of the heater matrix, and causes driver circuits 110 and 112 to provide energizing signals to the respective rows and columns for selective energization of the intended heater elements. The safety circuit 104 is operative to disable the drive circuits 110 and 112 to prevent damage or destruction of the heater elements in the event of control circuit failure or malfunction. If zero crossing signals or counter signals are not properly provided to the safety circuit, which could result in improper energization of the heater elements, one or more elements can be burned out by reason of the relatively high power which would be applied to a heater element for longer than a normal scan time.

Power applied to the heating elements can be varied to control the heater power as well as the heat profile. Power can be varied for example by employing pulse width modulation of the AC input power, and varying the duty cycle of the modulated input to provide an intended power level.

A tube 60 can be centrally disposed in the heater housing and is movable out of a center aperture 15 such as by a pneumatic actuator attached to the housing by fitting 62. The tube is connected to a suitable vacuum source and is operative to be extended beyond the nozzle face of the heater housing to engage the confronting surface of an electronic component and to retain the component by suction as the head is raised from an underlying circuit board. A component which has been unsoldered by the selective application of heat from the programmable heater can thereby be removed from the circuit board by the vacuum pickup disposed within the heater head. The tube can also be employed to place a component onto the circuit board.

Figure 5:
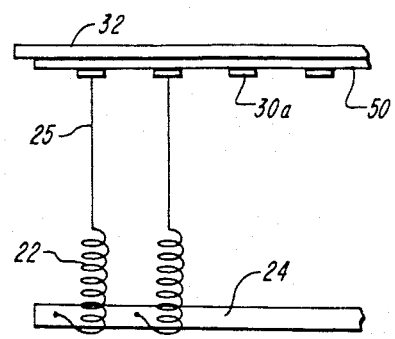
FIG. 5 is a cutaway pictorial view of an alternative embodiment of the programmable heater in accordance with the invention.

An alternative embodiment is shown in FIG. 5 wherein semiconductor chip diodes 30a are soldered or otherwise affixed to a row conductor 50 of the circuit board 32 and to each of which a lead 25 of respective heater coils 22 is electrically attached. These chip diodes are themselves known and comprise a semiconductor chip having planar electrodes on respective opposite faces thereof. One electrode is soldered or otherwise electrically attached to the underlying row conductor, and the other electrode is welded or otherwise electrically attached to the lead of the heater coils. The other lead of the heater coil is welded or otherwise electrically connected to the column bus strip 24 as in the above-described embodiment.

The invention can be implemented in a variety of configurations to suit specific requirements. The invention is not to be limited by what has been particularly shown and described except as indicated in the appended claims.

What is claimed is:

1. A programmable heater comprising:
    A housing having a nozzle surface containing an array of nozzle openings;
    a plurality of tubes each coupled to a respective nozzle opening;
    a plurality of electrical heating elements each disposed within a respective tube;
    electrical interconnection means for connecting each of the heating elements to an electrical control source;
    electrical control means operative to selectively energize predetermined ones of the heating elements to provide an intended heat profile;
    means for supplying gas to the housing for flow through the tubes and through the nozzle openings;
    the gas flowing past the energized heating elements being heated to provide the predetermined heat profile.

2. The heater of claim 1 wherein one end of each of said plurality of tubes is disposed in a respective opening in the nozzle surface.

3. The heater of claim 1 wherein the nozzle openings are provided in a nozzle plate affixed to the housing.

4. The heater of claim 1 wherein said gas supply means includes a chamber within the housing coupled to the plurality of tubes; and
    means for coupling the chamber of said housing to a source of pressurized gas.

5. The heater of claim 1 further including a vacuum probe disposed in said housing and having an end movable outwardly from the nozzle face for engagement with a component confronting the nozzle face.

6. The heater of claim 5 wherein the vacuum probe is disposed coaxially within the plurality of nozzle openings.

7. The heater of claim 1 wherein the electrical control means is also operative to provide a selected magnitude of power to the selectively energized heating elements to provide an intended heat profile and intended heat power.

8. The heater of claim 1 wherein the electrical interconnection means includes:
- a bus strip for each row of heating elements to which one end of each heating element of that row is connected;
- a plurality of diodes each electrically connecting the other end of a respective heating element to a respective row terminal to which the diodes of the respective row are connected; and
- a conductive interconnection between each bus strip and a respective column terminal.

9. The heater of claim 1 wherein the plurality of electrical heating elements are disposed in a plurality of rows;
- the heating elements of each row being connected in common to a bus strip for that row;
- each of the heating coils being connected via a respective diode to a row terminal;
- each of the bus strips being connected to a respective column terminal.

10. A programmable heater comprising:
- a housing having a nozzle surface containing an array of nozzle openings;
- a plurality of tubes disposed in rows and columns within said housing each of said plurality of tubes having a first end interfacing with a respective one of said nozzle openings;
- a plurality of electrical heating elements having first and second ends each of said plurality of electrical heating elements disposed within a one of said plurality of tubes;
- electrical interconnection means for connecting each of said plurality of heating elements to an electrical control source;
- means to selectively energize ones of the heating elements to define a predetermined heat profile; and
- a vacuum probe disposed in said housing and having an end moveable outwardly from the nozzle surface of engagement with a component confronting said nozzle surface.

11. The programmable heater of claim 10 wherein said electrical interconnection means comprises:
- a plurality of bus strips each interconnecting the first ends of the electrical heating elements of a single row or column; and
- a plurality of conducting rods each connecting a one of said plurality of interconnecting bus strips to said electrical control source.

12. The programmable heater of claim 11 further comprising means for supplying gas to the housing for flow through said tubes and nozzle openings past the energized heating elements and thereby being heated to provide the predetermined heat profile and wherein the electrical control source is further operative to provide a selected magnitude of power to the selectively energized heating elements to provide an intended heat power.

13. A programmable heater for providing selected heat profiles against a work surface, comprising:
- a housing;
- a plurality of electrical heating elements disposed in spaced configuration within said housing;
- means to selectively energize ones of said plurality of electrical heating elements; and
- means for directing air past said plurality of electrical heating elements to the work surface.

14. The heater of claim 13 further comprising:
- a plurality of tubes having first and second ends disposed within said housing and wherein said housing further includes a nozzle surface containing an array of nozzle openings; and
- a vacuum probe disposed in said housing and having an end moveable outwardly from the nozzle surface for engagement with a component confronting the nozzle surface.

15. The heater of claim 14 wherein
- the first end of each one of said plurality of tubes interfaces with a respective one of said array of nozzle openings;
- each one of said plurality of electrical heating elements is disposed within a respective one of said plurality of tubes; and
- said heat directing means includes means for supplying gas to the housing for flow through said tubes and through said nozzle openings to provide the selected heat profile.

* * * * *